United States Patent
Lee et al.

(10) Patent No.: US 12,077,681 B2
(45) Date of Patent: Sep. 3, 2024

(54) CMP SLURRY COMPOSITION FOR POLISHING TUNGSTEN PATTERN WAFER AND METHOD OF POLISHING TUNGSTEN PATTERN WAFER USING THE SAME

(71) Applicant: SAMSUNG SDI CO., LTD., Yongin-si (KR)

(72) Inventors: Ji Ho Lee, Suwon-si (KR); Young Gi Lee, Suwon-si (KR); Soo Yeon Sim, Suwon-si (KR); Hyun Woo Lee, Suwon-si (KR); Chang Suk Lee, Suwon-si (KR); Jong Won Lee, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 0 days.

(21) Appl. No.: 17/695,022

(22) Filed: Mar. 15, 2022

(65) Prior Publication Data
US 2022/0298382 A1    Sep. 22, 2022

(30) Foreign Application Priority Data
Mar. 18, 2021 (KR) .................. 10-2021-0035576

(51) Int. Cl.
| | | |
|---|---|---|
| C09G 1/04 | (2006.01) | |
| B24B 1/00 | (2006.01) | |
| B24B 37/04 | (2012.01) | |
| C09G 1/00 | (2006.01) | |
| C09G 1/02 | (2006.01) | |
| C09G 1/06 | (2006.01) | |
| C09K 3/14 | (2006.01) | |
| C09K 13/06 | (2006.01) | |
| H01L 21/306 | (2006.01) | |
| B01J 23/745 | (2006.01) | |
| B82Y 40/00 | (2011.01) | |
| H01L 21/304 | (2006.01) | |

(52) U.S. Cl.
CPC .................. *C09G 1/04* (2013.01); *B24B 1/00* (2013.01); *B24B 37/044* (2013.01); *C09G 1/00* (2013.01); *C09G 1/02* (2013.01); *C09G 1/06* (2013.01); *C09K 3/1463* (2013.01); *C09K 13/06* (2013.01); *H01L 21/30625* (2013.01); *B01J 23/745* (2013.01); *B82Y 40/00* (2013.01); *H01L 21/304* (2013.01)

(58) Field of Classification Search
None
See application file for complete search history.

(56) References Cited

U.S. PATENT DOCUMENTS

| | | | |
|---|---|---|---|
| 2005/0150598 A1* | 7/2005 | Moeggenborg | C09G 1/02 156/345.12 |
| 2015/0267082 A1* | 9/2015 | Grumbine | H01L 21/3212 438/693 |

FOREIGN PATENT DOCUMENTS

| | | |
|---|---|---|
| CN | 1272221 A | 11/2000 |
| CN | 1906260 A | 1/2007 |
| CN | 106414650 A | 2/2017 |
| CN | 107686703 A | 2/2018 |
| CN | 110734703 A | 1/2020 |
| CN | 111732898 A | 10/2020 |
| KR | 10-1049981 B1 | 7/2011 |
| KR | 2012-0078104 A | 7/2012 |
| KR | 2017-0072511 A | 6/2017 |
| KR | 2020-0113496 A | 10/2020 |
| TW | 200531787 A | 10/2005 |
| TW | 201600590 A | 1/2016 |

OTHER PUBLICATIONS

Chinese Office Action issued on Jul. 21, 2023, in the corresponding Chinese Patent Application No. 202210263056.0.

* cited by examiner

*Primary Examiner* — Jiong-Ping Lu
(74) *Attorney, Agent, or Firm* — Lee IP Law, P.C.

(57) ABSTRACT

A CMP slurry composition for polishing a tungsten pattern wafer and a method of polishing a tungsten pattern wafer, the composition comprising a solvent; an abrasive agent; and a dendritic poly(amidoamine) containing a terminal functional group that has a pKa of about 6 or less.

11 Claims, No Drawings

CMP SLURRY COMPOSITION FOR POLISHING TUNGSTEN PATTERN WAFER AND METHOD OF POLISHING TUNGSTEN PATTERN WAFER USING THE SAME

CROSS-REFERENCE TO RELATED APPLICATION

This application claims priority under 35 USC Section 119 to and the benefit of Korean Patent Application 10-2021-0035576, filed on Mar. 18, 2021, the entire disclosure of which is incorporated herein by reference.

BACKGROUND

1. Field

Embodiments relate to a CMP slurry composition for polishing a tungsten pattern wafer and a method of polishing a tungsten pattern wafer using the same.

2. Description of the Related Art

A chemical mechanical polishing (CMP) composition and a method of polishing (or flattening) a surface of a substrate have been considered. A polishing composition for polishing a metal layer (e.g., a tungsten layer) on a semiconductor substrate may include abrasive particles suspended in an aqueous solution and chemical accelerators, e.g., an oxidizing agent, a catalyst, and the like.

A process of polishing a metal layer using the CMP composition may include polishing only the metal layer, polishing the metal layer and a barrier layer, and polishing the metal layer, the barrier layer, and an oxide layer.

SUMMARY

The embodiments may be realized by providing a CMP slurry composition for polishing a tungsten pattern wafer, the composition including a solvent; an abrasive agent; and a dendritic poly(amidoamine) containing a terminal functional group that has a pKa of about 6 or less.

The terminal functional group that has a pKa of about 6 or less may include a carboxyl group, a phosphonate group, or a sulfonate group.

The terminal functional group that has a pKa of about 6 or less may include a carboxyl group.

The dendritic poly(amidoamine) may include poly(amidoamine) dendrimers.

A generation number of the dendritic poly(amidoamine) may be 1.5, 2.5, 3.5, 4.5, 5.5, 6.5, 7.5, 8.5, 9.5, or 10.5.

A generation number of the dendritic poly(amidoamine) may be 1.5, 2.5, 3.5, or 4.5.

The terminal functional group that has a pKa of about 6 or less may occupy about 10% to about 100% of total terminals in the dendritic poly(amidoamine).

The dendritic poly(amidoamine) may be present in an amount of about 0.0001 wt % to about 0.1 wt %, based on a total weight of the CMP slurry composition.

The abrasive agent may be present in an amount of about 0.001 wt % to about 20 wt %, based on a total weight of the CMP slurry composition.

The CMP slurry composition may further include an oxidizing agent, a catalyst, or an organic acid.

The oxidizing agent may be present in an amount of about 0.01 wt % to about 20 wt %, the catalyst may be present in an amount of about 0.001 wt % to about 10 wt %, and the organic acid may be present in an amount of about 0.001 wt % to about 10 wt %, all wt % being based on a total weight of the CMP slurry composition.

The CMP slurry composition may have a pH of about 1 to about 6.

The embodiments may be realized by providing a method of polishing a tungsten pattern wafer, the method comprising polishing a tungsten pattern wafer using the CMP slurry composition according to an embodiment.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

Herein, the singular forms "a", "an" and "the" are intended to include the plural forms as well, unless the context clearly indicates otherwise. As used herein, the term "or" is not an exclusive term, e.g., "A or B" would include A, B, or A and B.

Further, all variations of the terms "comprise," "include," "have," etc., when used in this specification, specify the presence of stated features, steps, operations, elements, and/or components, but do not preclude the presence or addition of one or more other features, steps, operations, elements, components, and/or groups.

Further, a numerical value related to a certain component is construed to include a tolerance range in interpretation of components, unless clearly stated otherwise.

As used herein to represent a specific numerical range, the expression "a to b" is inclusive of a and b.

Herein, * indicates a linking site between adjacent atoms.

A CMP slurry composition for polishing a tungsten pattern wafer according to an embodiment may help improve recess characteristics while minimizing reduction in polishing rate of a tungsten pattern wafer when an abrasive agent and a dendritic poly(amidoamine) containing a terminal functional group having a pKa of about 6 or less are included therein.

In an implementation, a CMP slurry composition for polishing a tungsten pattern wafer (hereinafter referred to as "CMP slurry composition") may include, e.g., (A) a solvent, (B) an abrasive agent, and (C) a dendritic poly(amidoamine) containing a terminal functional group having a pKa of about 6 or less.

Hereinafter, components of the CMP slurry composition will be described in detail.

(A) Solvent

The solvent may help reduce friction upon polishing a tungsten pattern wafer with an abrasive agent.

In an implementation, the solvent may be a polar solvent, a non-polar solvent, or a combination thereof. In an implementation, the solvent may include water (e.g., ultrapure water or deionized water), an organic amine, an organic alcohol, an organic alcohol amine, an organic ether, an organic ketone, or the like. In an implementation, the solvent may be ultrapure water or deionized water.

In an implementation, the solvent may be included in the balance amount in the CMP slurry composition.

(B) Abrasive Agent

The abrasive agent may help polish a tungsten pattern wafer at high polishing rate.

In an implementation, the abrasive agent may include, e.g., oxide abrasive particles of a metal or non-metal. In an implementation, the abrasive agent may include, e.g., silica, alumina, ceria, titania, or zirconia. In an implementation, the abrasive agent may be silica (e.g., colloidal silica).

In an implementation, the abrasive agent may be composed of spherical or aspherical particles and may have an average particle diameter ($D_{50}$) of about 10 nm to about 200 nm, e.g., about 20 nm to about 180 nm, or about 30 nm to about 150 nm. Within this range, the abrasive agent may help polish the tungsten pattern wafer at a sufficiently high polishing rate. As the particle diameter, the "average particle diameter (D50)" refers to a particle diameter corresponding to about 50 vol % in a volume distribution of abrasive particles distributed in the order of the minimum size to the maximum size.

In an implementation, the abrasive agent may be present in an amount of about 0.001 wt % to about 20 wt %, e.g., about 0.01 wt % to about 15 wt %, about 0.05 wt % to about 10 wt %, or about 0.1 wt % to about 8 wt %, based on a total weight of the CMP slurry composition. Within this range, the CMP slurry composition may help secure a high polishing rate with respect to the tungsten pattern wafer while securing dispersion stability of the composition.

(C) Dendritic poly(amidoamine)

The dendritic poly(amidoamine) may contain or include a terminal functional group having a pKa of about 6 or less. The CMP polishing composition according to an embodiment may include the dendritic poly(amidoamine) containing a terminal functional group having a pKa of about 6 or less (hereinafter, "dendritic poly(amidoamine)") to help improve a corrosion rate and flatness of the tungsten pattern wafer while minimizing reduction in polishing rate.

In an implementation, the terminal functional group having a pKa of about 6 or less may include, e.g., a carboxyl group, a phosphonate group, or a sulfonate group.

In an implementation, the terminal functional group having a pKa of about 6 or less may include a carboxyl group.

In an implementation, the dendritic poly(amidoamine) may include, e.g., random hyperbranched poly(amidoamine), dendrigraft poly(amidoamine), poly(amidoamine) dendron, poly(amidoamine) dendrimer, or the like. In an implementation, the dendritic poly(amidoamine) may include poly(amidoamine) dendrimer, thereby providing more advantages in improvement of flatness of the tungsten pattern wafer while reducing the corrosion rate and minimizing reduction in polishing rate.

In an implementation, the dendritic poly(amidoamine) may be produced by sequentially reacting a carboxylic acid derivative compound (e.g., a compound including a carboxylic acid group) and a diamine compound with a core amine compound having at least one hydrogen bound to a nitrogen atom. In an implementation, core amine compound may be represented by, e.g., Formula 1.

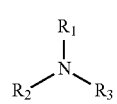

[Formula 1]

In Formula 1 $R_1$ to $R_3$ may each independently be or include, e.g., hydrogen or a $C_1$ to $C_{10}$ alkyl group. In an implementation, at least one of $R_1$ to $R_3$ may be hydrogen. In an implementation, $R_1$ may be, e.g., a group represented by *-$L_1$-N($R_{1a}$)($R_{1b}$) (in which $L_1$ is a single bond or a $C_1$ to $C_{10}$ alkylene group, and $R_{1a}$ and $R_{1b}$ are each independently hydrogen or a $C_1$ to $C_{10}$ alkyl group), and $R_2$ and $R_3$ may each independently be or include, e.g., hydrogen or a $C_1$ to $C_{10}$ alkyl group. In an implementation, at least one of $R_{1a}$, $R_{1b}$, $R_2$ and $R_3$ may be hydrogen. In an implementation, $R_1$ may be a group represented by *-$L_1$-N($R_{1a}$)($R_{1b}$), $R_2$ may be a group represented by *-$L_2$-N($R_{2b}$)($R_{2b}$) (in which $L_1$ and $L_2$ are each independently a single bond or a $C_1$ to $C_{10}$ alkylene group, and $R_{1a}$, $R_{1b}$, $R_{2a}$ and $R_{2b}$ are each independently a hydrogen or a $C_1$ to $C_{10}$ alkyl group), and $R_3$ may be a hydrogen or a $C_1$ to $C_{10}$ alkyl group. In an implementation, at least one of $R_{1a}$, $R_{1b}$, $R_{2a}$, $R_{2b}$ and $R_3$ may be hydrogen. In an implementation, $R_1$ may be a group represented by *-$L_1$-N($R_{1a}$)($R_{1b}$), $R_2$ may be a group represented by *-$L_2$-N($R_{2a}$)($R_{2b}$), and $R_3$ may be a group represented by *-$L_3$-N($R_{3a}$)($R_{3b}$) (in which $L_1$ to $L_3$ are each independently a single bond or a $C_1$ to $C_{10}$ alkylene group, and $R_{1a}$, $R_{1b}$, $R_{2a}$, $R_{2b}$, $R_{1a}$ and $R_{3b}$ are each independently hydrogen or a $C_1$ to $C_{10}$ alkyl group). In an implementation, at least one of $R_{1a}$, $R_{1b}$, $R_{2a}$, $R_{2b}$, $R_{3a}$ and $R_{3b3}$ may be hydrogen In an implementation, the core amine compound may include, e.g., ammonia ($NH_3$) or ethylene diamine. The carboxylic acid derivative compound may be represented by, e.g., $CH_2CH$-$L_4$-$CO_2X$ (in which $L_4$ is a single bond or a $C_1$ to $C_{10}$ alkylene group and X is hydrogen, a cation, a $C_1$ to $C_{10}$ alkyl group, or a $C_6$ to $C_{12}$ aryl group) and the diamine compound may be represented by, e.g., $H_2N$-$L_5$-$NH_2$ (in which $L_5$ is a single bond or a $C_1$ to $C_{10}$ alkylene group). In an implementation, the dendritic poly(amidoamine) may have a repeat group represented by Formula 2 and a surface group represented by Formula 3.

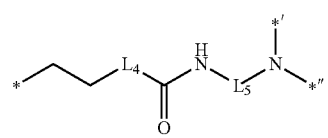

[Formula 2]

In Formula 2, $L_4$ and $L_5$ may each independently be or include, e.g., a single bond or a $C_1$ to $C_{10}$ alkylene group; and *, *' and *" denote linking sites to adjacent atoms.

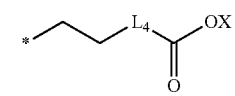

[Formula 3]

In Formula 3, $L_4$ may be or include, e.g., a single bond or a $C_1$ to $C_{10}$ alkylene group; X may be or may include, e.g., hydrogen, a cation, a $C_1$ to $C_{10}$ alkyl group, or a $C_6$ to $C_{12}$ aryl group; and * denotes a linking site to an adjacent atom.

In an implementation, the dendritic poly(amidoamine) may have a surface group including a terminal functional group having a pKa of about 6 or less, e.g., a carboxyl group, by changing the last step in sequential reaction of the carboxylic acid derivative compound and the diamine compound with the core amine compound. In an implementation, instead of the surface group of Formula 3, the dendritic poly(amidoamine) may have a surface group having a sulfonate group or a phosphonate group, e.g., a surface group represented by Formula 4 or a surface group represented by Formula 5.

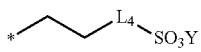
[Formula 4]

In Formula 4, $L_4$ may be or may include, e.g., a single bond or a $C_1$ to $C_{10}$ alkylene group; Y may be or may include, hydrogen, a cation, a $C_1$ to $C_{10}$ alkyl group, or a $C_6$ to $C_{12}$ aryl group; and * denotes a linking site to an adjacent atom.

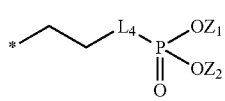
[Formula 5]

In Formula 5, $L_4$ may be or may include, a single bond or a $C_1$ to $C_{10}$ alkylene group; $Z_1$ and $Z_2$ may each independently be or include, e.g., hydrogen, a cation, a $C_1$ to $C_{10}$ alkyl group, or a $C_6$ to $C_{12}$ aryl group; and * denotes a linking site to an adjacent atom.

In an implementation, the dendritic poly(amidoamine) may have a generation number of n.5 (where n is an integer of 1 to 10). In an implementation, the dendritic poly(amidoamine) may have a generation number of 1.5, 2.5, 3.5, 4.5, 5.5, 6.5, 7.5, 8.5, 9.5, or 10.5. Within this range, the dendritic poly(amidoamine) may more advantageously improve the corrosion rate and recess characteristics while minimizing reduction in polishing rate of the tungsten pattern wafer. Here, "generation number" refers to the number of branched points from a core of the dendritic poly(amidoamine) to a surface thereof and a generation n dendritic poly(amidoamine) may have n branched points between the core and the surface. The generation n dendritic poly(amidoamine) may be produced through n+1 times repeated sequential reaction of the carboxylic acid/diamine compound with the core and a generation n.5 dendritic poly(amidoamine) may be produced through n+1 times repeated sequential reaction of the carboxylic acid/diamine compound with the core, followed by further reacting a derivative compound of the terminal functional group having a pKa of about 6 or less (a carboxylic acid derivative compound, a sulfonate group derivative compound [e.g., $CH_2CH-L_4-SO_3Y$ (in which $L_4$ is a single bond or a $C_1$ to $C_{10}$ alkylene group and Y is selected from among hydrogen and a cation)] or a phosphonate group derivative compound (e.g., $CH_2CH-L_4-P(=O)(OZ_1)(OZ_2)$ (in which $L_4$ is a single bond or a $C_1$ to $C_{10}$ alkylene group and $Z_1$ and $Z_2$ are each independently hydrogen, a $C_1$ to $C_{10}$ alkyl group, or a $C_6$ to $C_{12}$ aryl group)) therewith once. In an implementation, a generation 1.5 dendritic poly(amidoamine) may be produced through sequential reaction of the carboxylic acid derivative compound/diamine compound/carboxylic acid derivative compound/diamine compound/derivative compound of the terminal functional group having a pKa of about 6 or less with the core.

In an implementation, the dendritic poly(amidoamine) may have a generation number of 1.5, 2.5, 3.5, or 4.5.

In an implementation, the terminal functional group having a pKa of about 6 or less may occupy about 10% to about 100% of total terminal groups in the dendritic poly(amidoamine). Within this range, the dendritic poly(amidoamine) may more advantageously improve flatness of the tungsten pattern wafer while reducing the corrosion rate and minimizing reduction in polishing rate of the tungsten pattern wafer. In an implementation, the terminal functional group having a pKa of about 6 or less may occupy about 20% to about 100%, e.g., about 30% to about 100%, or about 40% to about 100%, of the total terminal groups.

In an implementation, the dendritic poly(amidoamine) may be present in an amount of about 0.0001 wt % to about 0.1 wt %, e.g., about 0.001 wt % to about 0.02 wt %, or about 0.002 wt % to about 0.01 wt %, based on the total weight of the CMP slurry composition. Within this range, the dendritic poly(amidoamine) may more advantageously improve the corrosion rate and recess characteristics while minimizing reduction in polishing rate of the tungsten pattern wafer.

In an implementation, the CMP slurry composition may further include, e.g., (D) an oxidizing agent, (E) a catalyst, or (F) an organic acid.

(D) Oxidizing Agent

The oxidizing agent may facilitate polishing of the tungsten pattern wafer by oxidizing the tungsten pattern wafer.

In an implementation, the oxidizing agent may include, e.g., an inorganic percompound, an organic percompound, bromic acid or salts thereof, nitric acid or salts thereof, chloric acid or salts thereof, chromic acid or salts thereof, iodic acid or salts thereof, iron or salts thereof, copper or salts thereof, rare-earth metal oxides, transition metal oxides, potassium dichromate, or mixtures thereof. Here, the percompound refers to a compound that contains at least one peroxide group (—O—O—) or an element in the highest oxidation state. In an implementation, the oxidizing agent may include a percompound (e.g., hydrogen peroxide, potassium periodide, calcium persulfate, potassium ferricyanide, and the like). In an implementation, the oxidizing agent may be hydrogen peroxide.

In an implementation, the oxidizing agent may be present in an amount of about 0.01 wt % to about 20 wt %, e.g., about 0.05 wt % to about 15 wt %, about 0.1 wt % to about 10 wt %, or about 0.5 wt % to about 8 wt %, based on the total weight of the CMP slurry composition. Within this range, the CMP slurry composition may help improve the polishing rate of the tungsten metal layer.

(E) Catalyst

The catalyst may help improve the polishing rate of the tungsten pattern wafer.

In an implementation, the catalyst may include, e.g., an iron ion compound, a complex compound of iron ions, or a hydrate thereof.

In an implementation, the iron ion compound may include, e.g., an iron trivalent cation-containing compound. The iron trivalent cation-containing compound may be a compound having iron trivalent cations, which are present as free cations in an aqueous solution. In an implementation, the iron trivalent cation-containing compound may include, e.g., iron chloride ($FeCl_3$), iron nitrate ($Fe(NO_3)_3$), or iron sulfate ($Fe_2(SO_4)_3$).

In an implementation, the complex compound of iron ions may include, e.g., an iron trivalent cation-containing complex compound. The iron trivalent cation-containing complex compound may include a compound formed by reacting an iron trivalent cation with an organic or inorganic compound having a functional group of, e.g., a carboxylic acid, a phosphoric acid, a sulfuric acid, an amino acid, or an amine, in an aqueous solution. Examples of the organic or inorganic compound may include citrate, ammonium citrate, p-toluene sulfonic acid (pTSA), 1,3-propylenediaminetetraacetic acid (PDTA), ethyl enediaminetetraacetic acid (EDTA), diethylenetriaminepentaacetic acid (DTPA), nitrilotriacetic acid (NTA), and ethylenediamine-N,N'-disuccinic acid (EDDS). Examples of the iron trivalent cation-containing compound may include ferric citrate, ferric ammonium citrate, Fe(III)-pTSA, Fe(III)-PDTA, and Fe(III)-EDTA.

In an implementation, the catalyst, e.g., the iron ion compound, the complex compound of iron ions, or the hydrate thereof, may be present in an amount of about 0.001 wt % to about 10 wt %, e.g., about 0.001 wt % to about 5 wt %, about 0.001 wt % to about 1 wt %, about 0.001 wt % to about 0.5 wt %, or about 0.002 wt % to about 0.1 wt %, based on the total weight of the CMP slurry composition. Within this range, it is more advantageous for the CMP slurry composition to improve the polishing rate of the tungsten metal layer.

(F) Organic Acid

The organic acid may help stabilize the pH of the CMP slurry composition.

In an implementation, the organic acid may include a polycarboxylic acid, such as malonic acid, maleic acid, malic acid, or the like, or an amino acid, such as glycine, isoleucine, leucine, phenylalanine, methionine, threonine, tryptophan, valine, alanine, arginine, cysteine, glutamine, histidine, proline, serine, tyrosine, and lysine, or the like.

In an implementation, the organic acid may be present in an amount of about 0.001 wt % to about 10 wt %, e.g., about 0.002 wt % to about 5 wt %, about 0.005 wt % to about 1 wt %, or about 0.01 wt % to about 0.5 wt %, based on the total weight of the CMP slurry composition. Within this range, the organic acid may help stabilize pH of the CMP slurry composition.

The CMP slurry composition may have a pH of about 1 to about 6, e.g., about 1.5 to about 5, or about 2 to about 4. Within this range, the CMP slurry composition may facilitate oxidation of the tungsten pattern wafer to prevent reduction in polishing rate.

In an implementation, the CMP slurry composition may further include a pH regulator to help maintain a suitable pH value.

In an implementation, the pH regulator may include an inorganic acid, e.g., nitric acid, phosphoric acid, hydrochloric acid, or sulfuric acid, or an organic acid, e.g., an organic acid having a $pK_a$ of about 6 or less (such as acetic acid or phthalic acid). The pH regulator may include, e.g., an ammonia solution, sodium hydroxide, potassium hydroxide, ammonium hydroxide, sodium carbonate, or potassium carbonate.

In an implementation, the CMP slurry composition may further include a suitable additive, e.g., a biocide, a surfactant, a dispersant, a modifier, a surface activating agent, or the like. In the CMP slurry composition, the additive may be present in an amount of about 0.0001 wt % to about 5 wt %, e.g., about 0.0005 wt % to about 1 wt % or about 0.001 wt % to about 0.5 wt %. Within this range, the additives may help realize effects thereof without adversely affecting the polishing rate.

In accordance with another embodiment, there is provided a method of polishing a tungsten pattern wafer. The polishing method may include polishing a tungsten pattern wafer using the CMP slurry composition according to the present invention.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1

A CMP slurry composition was prepared by mixing 0.5 wt % of silica particles having an average particle size (D50) of about 95 nm and electrical charges of about 35 mV as an abrasive agent, 0.004 wt % of a generation 1.5 poly(amidoamine) dendrimer (PAMAM dendrimer, ethylenediamine core, generation 1.5, Sigma Aldrich) as a dendritic poly (amidoamine) containing a terminal carboxylic group, 0.03 wt % of iron nitrate nonahydrate as a catalyst, 0.04 wt % of malonic acid as an organic acid, 0.04 wt % of glycine, and the balance of deionized water as a solvent, based on the total weight of the CMP slurry composition. The CMP slurry composition was regulated to have a pH of 2.5 using a pH regulator. Then, 5 wt % of hydrogen peroxide was added as an oxidizing agent to the slurry composition immediately before polishing (or corrosion) evaluation of a tungsten pattern wafer.

Example 2

A CMP slurry composition was prepared in the same manner as in Example 1 except that a generation 2.5 poly(amidoamine) dendrimer (PAMAM dendrimer, ethylenediamine core, generation 2.5, Sigma Aldrich) was used instead of the generation 1.5 poly(amidoamine) dendrimer.

Example 3

A CMP slurry composition was prepared in the same manner as in Example 1 except that a generation 3.5 poly(amidoamine) dendrimer (PAMAM dendrimer, ethylenediamine core, generation 3.5, Sigma Aldrich) was used instead of the generation 1.5 poly(amidoamine) dendrimer.

Example 4

A CMP slurry composition was prepared in the same manner as in Example 1 except that a generation 1.5 poly(amidoamine) dendrimer containing a sulfonate surface group as represented by Formula 4 was used instead of the generation 1.5 poly(amidoamine) dendrimer.

Comparative Example 1

A CMP slurry composition was prepared in the same manner as in Example 1 except that the generation 1.5 poly(amidoamine) dendrimer was not added.

Comparative Example 2

A CMP slurry composition was prepared in the same manner as in Example 1 except that a generation 2.0 poly(amidoamine) dendrimer (PAMAM dendrimer, ethylenediamine core, generation 2.0, Sigma Aldrich) was used instead of the generation 1.5 poly(amidoamine) dendrimer.

Comparative Example 3

A CMP slurry composition was prepared in the same manner as in Example 1 except that a generation 3.0 poly(amidoamine) dendrimer (PAMAM dendrimer, ethylenediamine core, generation 3.0, Sigma Aldrich) was used instead of the generation 1.5 poly(amidoamine) dendrimer.

Comparative Example 4

A CMP slurry composition was prepared in the same manner as in Example 1 except that linear polyethyleneimine (average Mn: 2,500, Sigma Aldrich) was used instead of the generation 1.5 poly(amidoamine) dendrimer.

Comparative Example 5

A CMP slurry composition was prepared in the same manner as in Example 1 except that branched polyethyleneimine (average Mn: 1,800, Sigma Aldrich) was used instead of the generation 1.5 poly(amidoamine) dendrimer.

Evaluation Example 1: Tungsten Corrosion Rate (Unit: Å/Min

Evaluation of tungsten corrosion was carried out at 50° C. and tungsten corrosion rate was calculated based on electrical resistance corresponding to a difference in thickness before and after etching a tungsten blanket wafer (3 cm×3 cm) using a CMP slurry composition containing 5 wt % of hydrogen peroxide as an oxidizing agent.

Evaluation Example 2: Polishing Evaluation

Polishing evaluation was carried out on the CMP slurry compositions under the following polishing conditions.
[Polishing Evaluation Condition]
(1) Polishing Machine
  Reflexion 300 mm (AMAT Co., Ltd.)
(2) Polishing Condition
  Polishing pad: IC1010/SubaIV Stacked (Rodel Co., Ltd.)
  Head speed: 101 rpm
  Platen speed: 100 rpm
  Pressure: 2.5 psi
  Retainer Ring Pressure: 8 psi
  Slurry flow rate: 250 ml/min
  Polishing time: 45 sec
(3) Polishing Target
  Recess evaluation: A commercially available tungsten pattern wafer (MIT 854, 300 mm) was used.
  Tungsten polishing rate evaluation: A blanket wafer was prepared by sequentially depositing titanium nitride (TiN) and tungsten to thicknesses of 300 Å and 6,000 Å, respectively, on a polycrystalline silicon substrate.
(4) Analysis Method
  Polishing rate of tungsten pattern wafer (unit: Å/min): Polishing rate of the tungsten metal layer was calculated based on electric resistance corresponding to a difference in film thickness before and after polishing in evaluation under the above polishing conditions.

Recess (unit: nm): After polishing a wafer under the above polishing conditions, a recess was evaluated by measuring a profile in a 0.18 μm×0.18 μm hole region in the wafer using an atomic force microscope (Uvx-Gen3, Bruker Co., Ltd.).

TABLE 1

|  | Example | | | | Comparative Example | | | | |
| --- | --- | --- | --- | --- | --- | --- | --- | --- | --- |
|  | 1 | 2 | 3 | 4 | 1 | 2 | 3 | 4 | 5 |
| Tungsten corrosion rate (Å/min) | 47 | 43 | 29 | 61 | 180 | 63 | 59 | 208 | 98 |
| Tungsten polishing rate (Å/min) | 3,888 | 4,026 | 3,892 | 4,232 | 4,847 | 1,025 | 1,116 | 401 | 332 |
| Recess (nm) | 8.3 | 10.5 | 8.6 | 13.5 | 30.1 | 9.9 | 8.8 | — | — |

Comparative Examples 4 and 5: Recess Evaluation was Omitted Due to Low Tungsten Polishing Rates From the above results, it may be seen that the CMP slurry compositions according to the Examples improved recess characteristics of a tungsten pattern wafer and reduced the corrosion rate thereof while minimizing a reduction in polishing rate thereof.

Conversely, it may be seen that the composition free from the dendritic poly(amidoamine) (Comparative Example 1) exhibited an increase in tungsten corrosion rate and failed to improve recess characteristics; the composition containing the generation 2.0 poly(amidoamine) dendrimer or the generation 3.0 poly(amidoamine) dendrimer instead of the dendritic poly(amidoamine) of the Examples (Comparative Examples 2 and 3) exhibited a decrease in tungsten polishing rate. In addition, it may be seen that the composition containing linear polyethyleneimine or branched polyethyleneimine instead of the dendritic poly(amidoamine) of the Examples (Comparative Examples 4 and 5) exhibited an increase in tungsten corrosion rate and a decrease in tungsten polishing rate.

One or more embodiments may provide a CMP slurry composition for polishing a tungsten pattern wafer, which may help improve recess characteristics and reduce a corrosion rate while minimizing reduction in polishing rate of a tungsten pattern wafer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A CMP slurry composition for polishing a tungsten pattern wafer, the composition comprising:
  a solvent;
  an abrasive agent; and a dendritic poly(amidoamine) containing a terminal functional group that has a pKa of about 6 or less,
wherein:
the terminal functional group that has a pKa of about 6 or less occupies about 10% to about 100% of total terminals in the dendritic poly(amidoamine),
the dendritic poly(amidoamine) is present in an amount of about 0.0001 wt % to about 0.1 wt %, based on a total weight of the CMP slurry composition, and
a generation number of the dendritic poly(amidoamine) is 1.5, 2.5, 3.5, 4.5, 5.5, 6.5, 7.5, 8.5, 9.5, or 10.5.

2. The CMP slurry composition as claimed in claim 1, wherein the terminal functional group that has a pKa of about 6 or less includes a carboxyl group, a phosphonate group, or a sulfonate group.

3. The CMP slurry composition as claimed in claim 1, wherein the terminal functional group that has a pKa of about 6 or less includes a carboxyl group.

4. The CMP slurry composition as claimed in claim 1, wherein the dendritic poly(amidoamine) includes poly(amidoamine) dendrimers.

5. The CMP slurry composition as claimed in claim 1, wherein a generation number of the dendritic poly(amidoamine) is 1.5, 2.5, 3.5, or 4.5.

6. The CMP slurry composition as claimed in claim 1, wherein the abrasive agent is present in an amount of about 0.001 wt % to about 20 wt %, based on a total weight of the CMP slurry composition.

7. The CMP slurry composition as claimed in claim 1, further comprising an oxidizing agent, a catalyst, or an organic acid.

8. The CMP slurry composition as claimed in claim 7, wherein:
the oxidizing agent is present in an amount of about 0.01 wt % to about 20 wt %,
the catalyst is present in an amount of about 0.001 wt % to about 10 wt %, and
the organic acid is present in an amount of about 0.001 wt % to about 10 wt %, all wt % being based on a total weight of the CMP slurry composition.

9. The CMP slurry composition as claimed in claim 1, wherein the CMP slurry composition has a pH of about 1 to about 6.

10. The CMP slurry composition as claimed in claim 1, wherein the terminal functional group that has a pKa of about 6 or less occupies about 40% to about 100%, of total terminals in the dendritic poly(amidoamine).

11. The CMP slurry composition as claimed in claim 1, wherein the dendritic poly(amidoamine) is present in an amount of about 0.002 wt % to about 0.01 wt %, based on the total weight of the CMP slurry composition.

* * * * *